(12) United States Patent
Nguyen et al.

(10) Patent No.: US 6,410,451 B2
(45) Date of Patent: *Jun. 25, 2002

(54) TECHNIQUES FOR IMPROVING ETCHING IN A PLASMA PROCESSING CHAMBER

(75) Inventors: Thomas D. Nguyen, Campbell; George Mueller, San Jose; Peter McGrath, Roseville, all of CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/405,949

(22) Filed: Sep. 27, 1999

(51) Int. Cl.$^7$ ............................................. H01L 21/302
(52) U.S. Cl. ..................... 438/713; 438/714; 438/743; 438/744; 438/723; 438/724; 438/624
(58) Field of Search ................................. 438/723, 724, 438/714, 715, 743, 744, 687, 624, 618, 637, 638, 639, 640, 713

(56) References Cited

U.S. PATENT DOCUMENTS 5,973,799 A * 10/1999 Koshiiski et al. ............ 438/723
6,043,164 A *  3/2000 Nguyen et al. .............. 438/736

FOREIGN PATENT DOCUMENTS

| JP | 07-263409 | * 10/1995 |
| JP | 10-199869 | 7/1998 |
| WO | WO 97/24750 | 7/1997 |
| WO | WO 99/16110 | 4/1999 |

OTHER PUBLICATIONS

"Microloading Effect In Ultrafine $SiO^2$ Hole/Trench". J. Vac. Sci., A. 17(4,Pt. 1); Jul. 16, 1999; Feurprier et al., pp. 1556–1561.*

Miyata et al., "$CF_x$ radical generation by plasma interaction with fluorocarbon films on the reactor wall," J. Vac. Sci. Technol. A 14(4), Jul./Aug. 1996.

Hayashi et al., "Characterization of highly Selective $SiO_2$/$Si_3N_4$ Etching of High–Aspect–Ratio Holes," 1995 Dry Process Symposium, VIII–2, pp. 225–231.

Kubota et al., "Measurement of Fluorocarbon Radicals generated from $C_4F_8$/$H_2$ Inductively Coupled Plasma: Study on $SiO_2$ Selective Etching Kinetics," 1994 Dry Process Symposium, VI–5, pp. 205–211.

Hayashi et al., "Mechanism of Highly selective $SiO_2$ to $Si_3N_4$ etching using $C_4F_8$+ CO plasma," 1996 Dry Process Symposium, IV–3, pp. 135–141.

Feurprier et al., "Microloading effect in ultrafine $SiO_2$ hole/trench etching", J. Vac. Sci. Technol. A 17(4), Jul./Aug. 1999, pp. 1556–1561.

* cited by examiner

Primary Examiner—George Goudreau
(74) Attorney, Agent, or Firm—Beyer Weaver & Thomas, LLP

(57) ABSTRACT

Improved methods and apparatus for chemically assisted etch processing in a plasma processing system are disclosed. In accordance with one aspect of the invention, improved techniques suitable for performing an etch process in the plasma processing can be realized. The invention operates to reduce the critical dimension bias that is associated with the etch process. Lower critical dimension bias provides many benefits. One such benefit is that features with higher aspect ratio can be etched correctly. In addition, several other undesired effects, e.g., micro loading, bowing and passivation, can be curtailed using the techniques of the present invention.

32 Claims, 7 Drawing Sheets

| Process CxFy, O2 | CxFy / O2 Ratio |
|---|---|
| 9.5 C4F8, 6 O2, 10°C, 180s | 1.58 |
| 8 C3F6, 4 O2, 200s | 2.00 |
| 10 C3F6, 5 O2, 190s | 2.00 |
| 12 C3F6, 6 O2, 180s | 2.00 |
| 9 C3F6, 4 O2, 200s | 2.25 |
| 14 C3F6, 6 O2, 10°C, 180s | 2.33 |
| 12 C3F6, 5 O2, 190s | 2.40 |
| 15 C3F6, 6 O2, -2°C, 180s | 2.50 |
| 16 C3F6, 6 O2, -2°C, 180s | 2.67 |
| 17 C3F6, 6 O2, -2°C, 180s | 2.83 |

FIG. 6

TECHNIQUES FOR IMPROVING ETCHING IN A PLASMA PROCESSING CHAMBER

BACKGROUND OF THE INVENTION

1. Field of the Invention

The present invention relates to fabrication of semiconductor integrated circuits and, more particularly, to improved methods for chemically assisted etch processing in a plasma processing system.

2. Description of the Related Art

In the fabrication of semiconductor-based devices, e.g., integrated circuits or flat panel displays, layers of materials may alternately be deposited onto and etched from a substrate surface. During the fabrication process, various layers of material, e.g., borophosphosilicate glass (BPSG), polysilicon, metal, and etc., are deposited on the substrate and patterned with a photoresist process. Thereafter, portions of the layers can be etched away to form various features, e.g., interconnect lines, via connections, trenches, and etc.

The process of etching may be accomplished by a variety of known techniques, including plasma-enhanced etching. In plasma-enhanced etching, the actual etching typically takes place inside a plasma processing chamber of a plasma processing system. To form the desired pattern on the substrate surface, an appropriate mask (e.g., a photoresist mask) is typically provided. With the substrate in the plasma processing chamber, a plasma is then formed from a suitable etchant source gas, or mixture of gases. The plasma is used to etch areas that are left unprotected by the mask, thereby forming the desired pattern. In this manner, portions of the layers are etched away to form interconnect lines, via connections, trenches, and other features. The deposition and etching processes may be repeated until the desired circuit is obtained.

Fabrication of the modern integrated circuits continues to challenge those skilled in the art to find new techniques to enhance the control over the etching process. By way of example, as the features for the modern integrated circuits have been reduced in size, it has become increasingly more difficult to etch the desired features using conventional etching techniques. To elaborate, as features have become increasingly smaller, it has become increasingly more difficult to achieve a uniform etch rate for the etching processes. For example, it has become increasingly more difficult to achieve the same etch rate for the regions where the features are relatively closely spaced and for the regions where the features are in relatively wider spacing. This problem has been referred to as the micro loading effect.

In order to overcome a variety of the problems associated with etching of increasing smaller features in the modern integrated circuit, more recent techniques have proposed alternative chemistries for the etchant source gases. By way of example, one recent development has identified innovative chemistries that can enhance selectivity, in addition to effectively reducing the effects of micro loading. For example, one such innovative chemistries is the combination of $C_4F$, $N_2$, and Ar which is described in the U.S. Pat. No. 6,090,304, filed on Aug. 28, 1997.

Although chemistries such as the combination of $C_4F$, $N_2$, and Ar are effective against micro loading and can significantly enhance selectivity, unfortunately, these chemistries are not suitable for situations where critical dimensions of the etched features are an important consideration, e.g., situations where relatively small features are to be etched and the margin for error is relatively smaller. To elaborate, in some etching processes, there is a difference between the desired (or pre-etch) critical dimension and the post-etch critical dimension of a feature. This difference can be referred to as the critical dimension bias. The critical dimension bias, as used herein, refers to the difference between a desired (or the pre-etch) dimension and the corresponding post etch dimension of a feature. Usually, the etching process results in enlarging the critical dimension of a feature.

To facilitate discussion of the critical dimension bias, FIGS. 1 and 2, respectively, illustrate a cross section view of a pre-etch wafer 100 and a cross section view of a post-etch wafer 200. Wafer 100 is shown as having a layer stack 102 disposed above the surface of a substrate 104, e.g., silicon. The layer stack 102 includes an oxide layer 106, a polysilicon layer 108, and a dielectric layer 110. The oxide layer 106, typically comprising $SiO_2$, is disposed above silicon substrate 104. Above oxide layer 106, there may be disposed a polysilicon layer 108. A dielectric layer 110, e.g., a BPSG, a PSG, a $SiO_2$, or a TEOS layer 110, may be disposed above the polysilicon layer 108.

A distance D1 (between masked regions 112a and 112b) represents the desired (or pre-etch) width dimension of a feature that is to be etched through the layer 110 via an open area 118. By way of example, for relatively small features, distance D1 can be about 0.25 $\mu$m.

After the etching process as illustrated in FIG. 2, a region 120 is formed. The region 120 extends through the layer 110 and a portion of the layer 108. A distance (gap) D2 represents the post-etch width dimension of the feature that has been etched in the region 120. The distance D2 is significantly larger than distance D1. By way of example, it is not uncommon for the distance D2 to be 0.05 $\mu$m larger than distance D1. However, for small features, such as 0.25 $\mu$m, a variation of 0.05 $\mu$m represents an increase of about 20%.

As appreciated by those skilled in the art, such a significant difference between distances D1 and D2 (critical dimension bias) is highly undesirable. The critical dimension bias can cause a multitude of problems in the fabricated Integrated circuit. By way of example, an enlarged etched feature can overlap with another etched feature. Overlapping etched features can render the integrated circuit defective.

Moreover, as the size of the modern integrated circuit has been reduced, the distances between etched features, e.g., interconnect lines, via connections, trenches, and other features, have become increasingly smaller. In other words, in the modern integrated circuits, the margin of error (i.e., deviation from the required dimensions as required by the specification) for the etched features, has become increasing smaller and smaller. Thus, the margin of error is also becoming smaller and smaller. As such, the critical dimension bias has become a substantial problem.

In view of foregoing, there is a need for improved etching techniques that effectively reduce critical dimension bias.

SUMMARY OF THE INVENTION

Broadly speaking, the invention relates to improved methods for chemically assisted etch processing in a plasma processing system. Some embodiments of the invention are summarized below.

In one embodiment a plasma processing system, including a plasma processing chamber suitable for use with the improved methods of the present application, is described. The disclosed plasma processing system can be utilized to perform an etch process for a selected layer of material that is deposited on a wafer substrate. The selected layer of material can be deposited using a known deposition method.

In another embodiment a method for etching through a selected portion of a deposited dielectric layer is described. The dielectric layer can be deposited on a wafer substrate by a conventional deposition method. The method for etching through the selected portion of the deposited dielectric layer is performed in a plasma processing chamber. A wafer substrate having a deposited layer identified for etching is placed in the plasma processing system. An etchant source gas that consists primarily of a combination of $C_3F_6$ and $O_2$ gases is introduced into the plasma processing chamber. The etchant source gas, the temperature and the pressure in the processing chamber are stabilized. Then the electrodes in the plasma processing chamber are powered up to ignite the plasma to perform the etching process, in accordance with this embodiment of the present invention.

This invention has numerous advantages. One advantage is that the critical dimension bias that is associated with the etch process is effectively reduced. Another advantage is that other undesirable side effects of the etching process, e.g., bowing, micro loading, passivation, etc., can be curtailed. Yet another advantage is that features with higher aspect ratios can be etched in accordance with the improved techniques of the present invention.

Other aspects and advantages of the invention will become apparent from the following detailed description, taken in conjunction with the accompanying drawings illustrating, by way of example, the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 6 illustrates some exemplary flow rate ratios of fluorocarbon gases to the gas $O_2$.

DETAILED DESCRIPTION OF THE INVENTION

This invention pertains to improved methods and apparatus for chemically assisted etch processing in a plasma processing system. In accordance with one aspect, the inventive chemistries of the present invention can be utilized to enhance process control for chemically assisted etch processing in a plasma processing system. Among other things, the present invention operates to significantly reduce the critical dimension bias for features that are etched by the plasma processing system. In addition, the present invention can be utilized to counter some of the undesired effects associated with the etch process. In one embodiment, the inventive gas chemistries of the present invention consist primarily of a mixture of $C_3F_6$ and $O_2$ gases.

Embodiments of this aspect of the invention are discussed below with reference to FIGS. 3–6. However, those skilled in the art will readily appreciate that the detailed description given herein with respect to these figures is for explanatory purposes as the invention extends beyond these limited embodiments.

Figure 1:
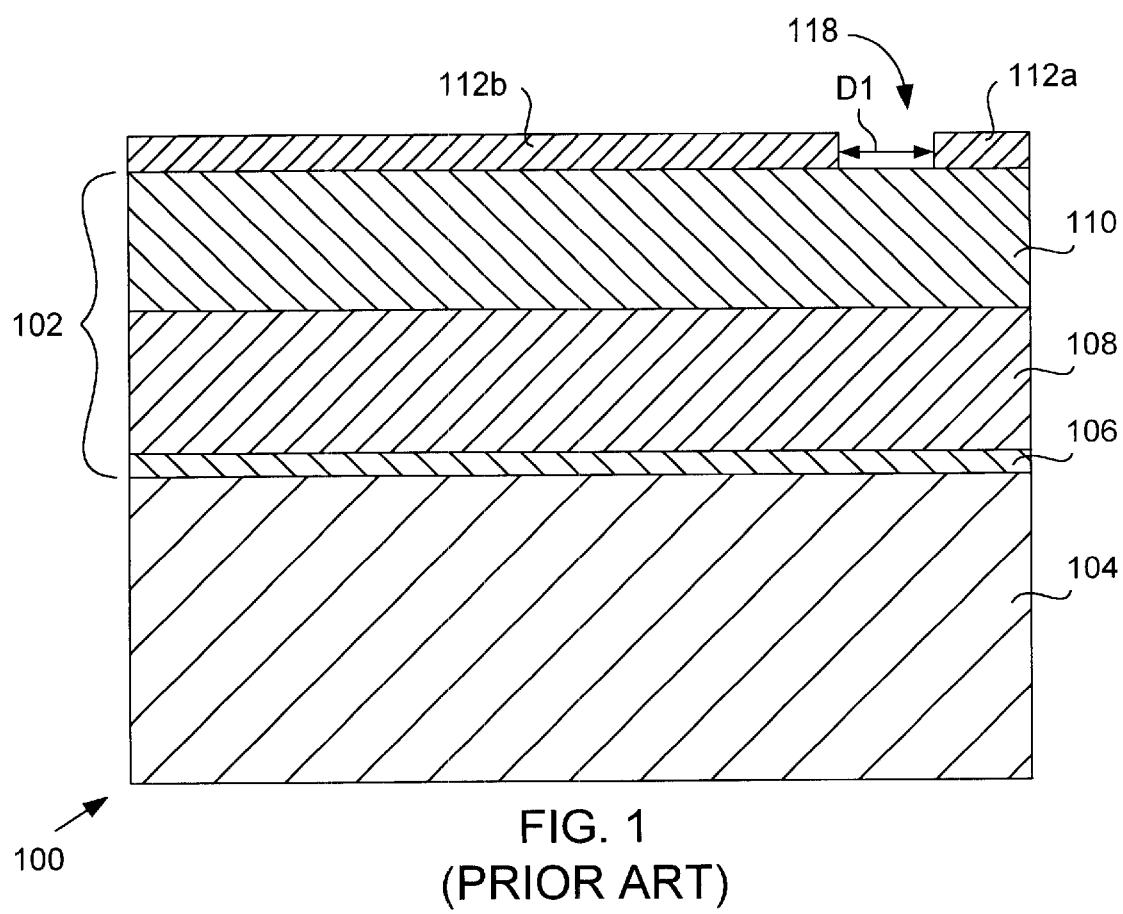
FIG. 1 illustrates a cross section view of a pre-etch wafer that is to be processed in a plasma processing chamber.
Figure 2:
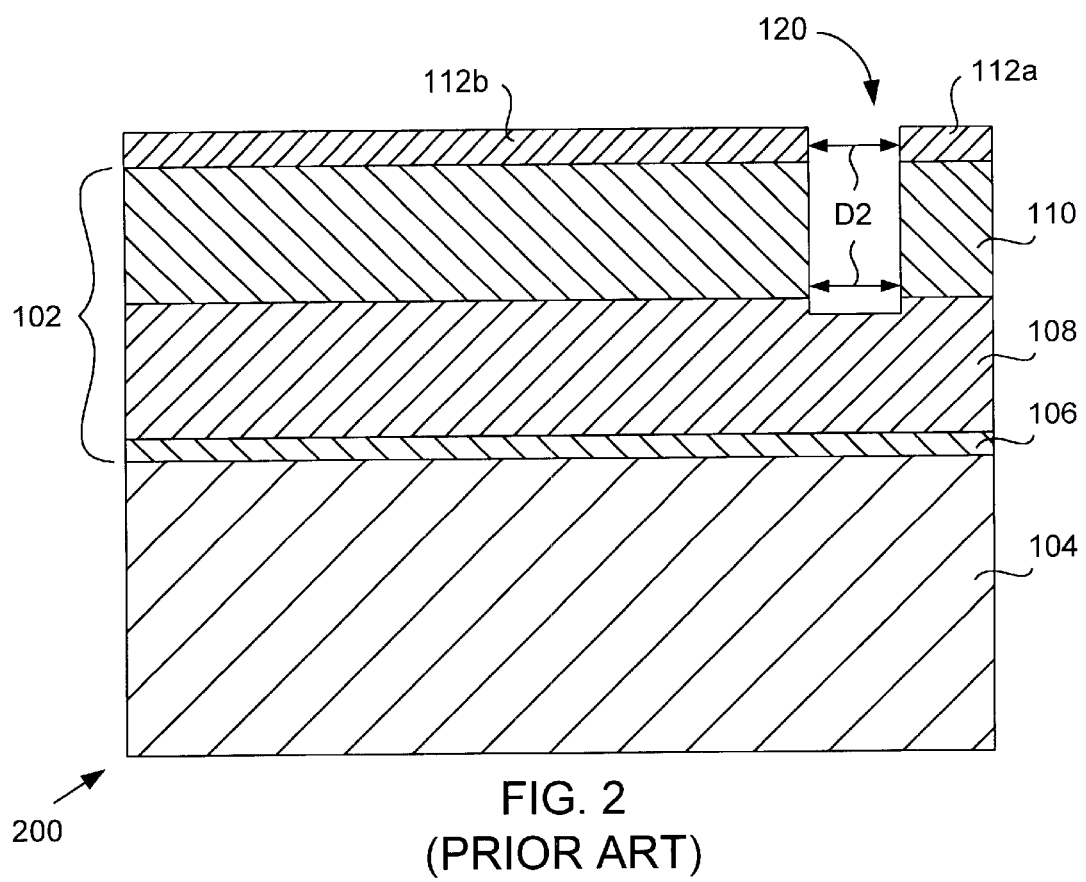
FIG. 2 illustrates a cross section view of a post-etch wafer that after it has been processed in the plasma processing chamber.
Figure 3:
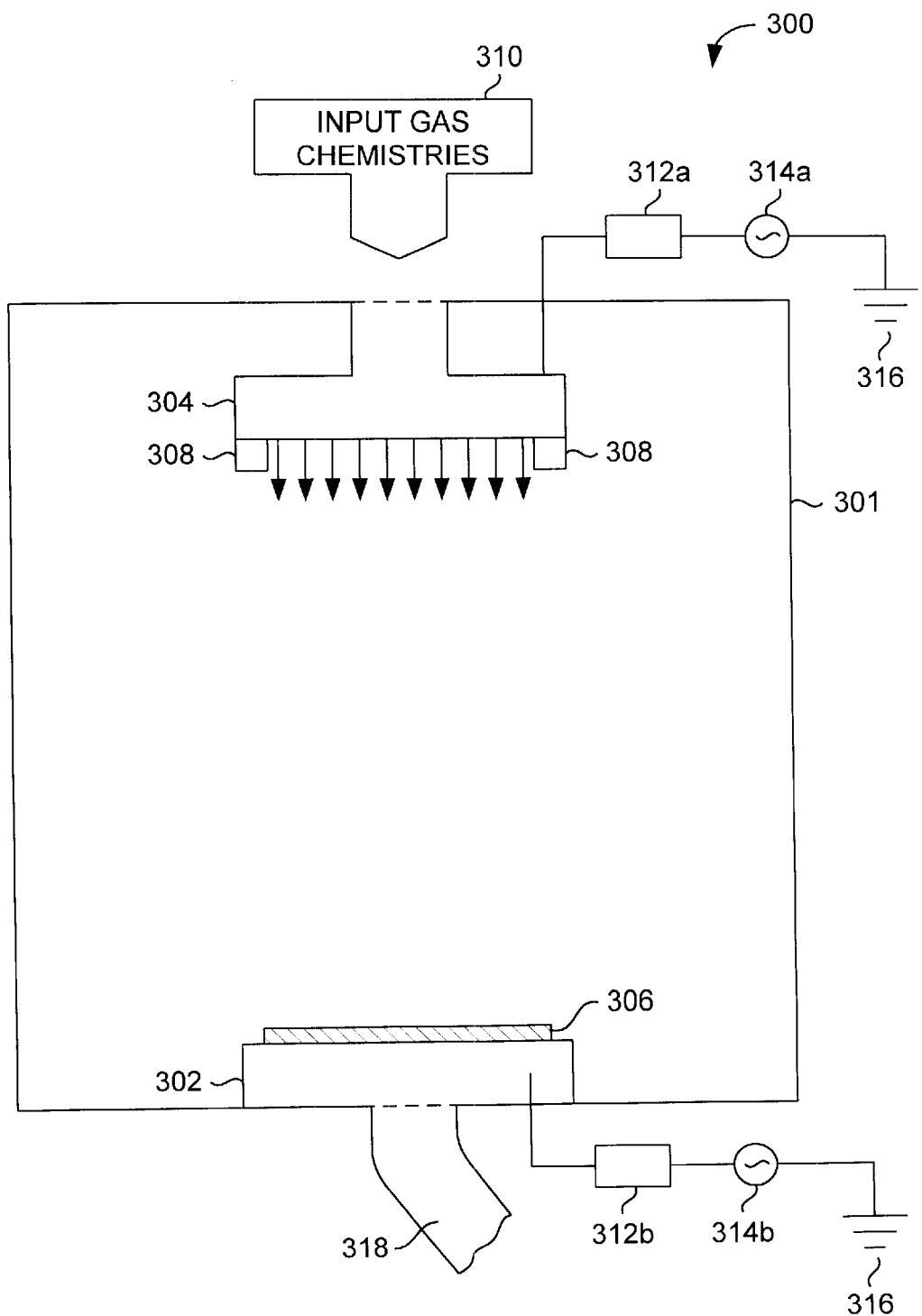
FIG. 3 illustrates a plasma processing system in accordance with one embodiment of the present invention.

As previously noted, the inventive chemistries of the present invention can be utilized to enhance process control for chemically assisted etch processing in a plasma processing system. To facilitate understanding, FIG. 3 illustrates a plasma processing system 300 in accordance with one embodiment of the present invention.

The plasma processing system 300 includes a processing chamber 301 that includes a bottom electrode 302 and a top electrode 304. A wafer 306 is placed on the bottom electrode 302 (e.g., chuck). The top electrode 304 can also supply the input gas chemistries 310 to the process chamber 301. The top electrode 304 may include a quartz confinement ring 308 that circles a lower edge of the top electrode 304.

The surface of the wafer 306 is etched by an appropriate etchant source gas that is released as the input gas chemistries 310 into the wafer processing chamber 301. An inventive etchant source gas can be provided in accordance with one aspect of the present invention to, among other things, significantly reduce critical dimension bias associated with the etch process. In one embodiment, the inventive gas chemistries of the present invention consist primarily of a mixture of $C_3F_6$ and $O_2$ gases. The inventive chemistries of the present invention can provide many additional benefits that will become apparent.

As noted above, the etchant source gas can be released through the top electrode 304. It should be noted that the etchant source gas may also be released by other mechanisms such as via a gas ring disposed inside the wafer processing chamber 301 or via ports built into the walls of the wafer processing chamber 301.

As illustrated in FIG. 3, the process chamber 301 can utilize a dual frequency parallel plate processing arrangement where a first radio frequency (RF) source 314a is coupled to the top electrode 304 through a RF matching network 312a. In a similar manner, the bottom electrode 302 is coupled to a second RF source 314b through a second RF matching network 312b. Each of the RF sources 314a and 314b are coupled at one end to ground 316. In operation, the process chamber 301 may exhaust processing gasses through an opening 118.

As is known by those skilled in the art, in the case of etch processes, a number of parameters within the plasma processing chamber 301 are tightly controlled to maintain high tolerance etch results. Process parameters governing etch results may include gas composition, plasma excitation, plasma distribution over the wafer 306, etc. Since the etch tolerance (and resulting semiconductor-based device performance) is highly sensitive to such process parameters, accurate control thereof is required.

In one embodiment, the wafer 306 is subjected to a multitude of processing operations, including the etching performed in the process chamber 301, that enables the fabrication of a plurality of semiconductor dies. The semiconductor dies can in turn be packaged to produce a plurality of products, e.g., packaged integrated circuits.

By way of example, the processing chamber 301 can be a Lam Research Rainbow 4520XLE processing chamber, which is available from Lam Research Corporation of Fremont, Calif. Alternatively, the processing chamber 301 may also be a Lam Research Exelan processing chamber, which is also available from Lam Research Corporation of Fremont, Calif. It should be noted that in some dual frequency processing chambers, e.g., Lam Research Exelan processing chamber, both of the RF sources 314a and 314b are coupled to the lower electrode 302. Of course, other suitably arranged processing chambers can be used to achieve the improved etching results, in accordance with the present invention.

Further, as it will be understood by those skilled in the art, the invention may be practiced in a number of other suitably arranged processing chambers. For example, the invention is applicable to processing chambers that deliver energy to the plasma through capacitively coupled parallel electrode plates, through electron cyclotron resonance (ECR) microwave plasma sources, through inductively coupled RF sources such as helicon, helical resonators, and transformer coupled plasma (TCP). ECR and TCP plasma processing systems, among others, are also available from Lam Research Corporation of Fremont, Calif. Other examples of suitable processing chambers include an inductive plasma source (IPS), a decoupled plasma source (DPS), and a dipole ring magnet (DRM). IPS and DPS plasma processing systems are available from Applied Materials of Santa Clara, Calif. DRM source plasma processing equipment are available from Tokyo Electron Limited of Japan.

As noted in the background, in semiconductor fabrication, features may be formed on a semiconductor wafer or substrate. More particularly, successive layers of various materials may be deposited on the semiconductor wafer or substrate. Thereafter, portions of selected deposited layers are etched away to form interconnect lines, trenches, and other features.

Figure 4A:
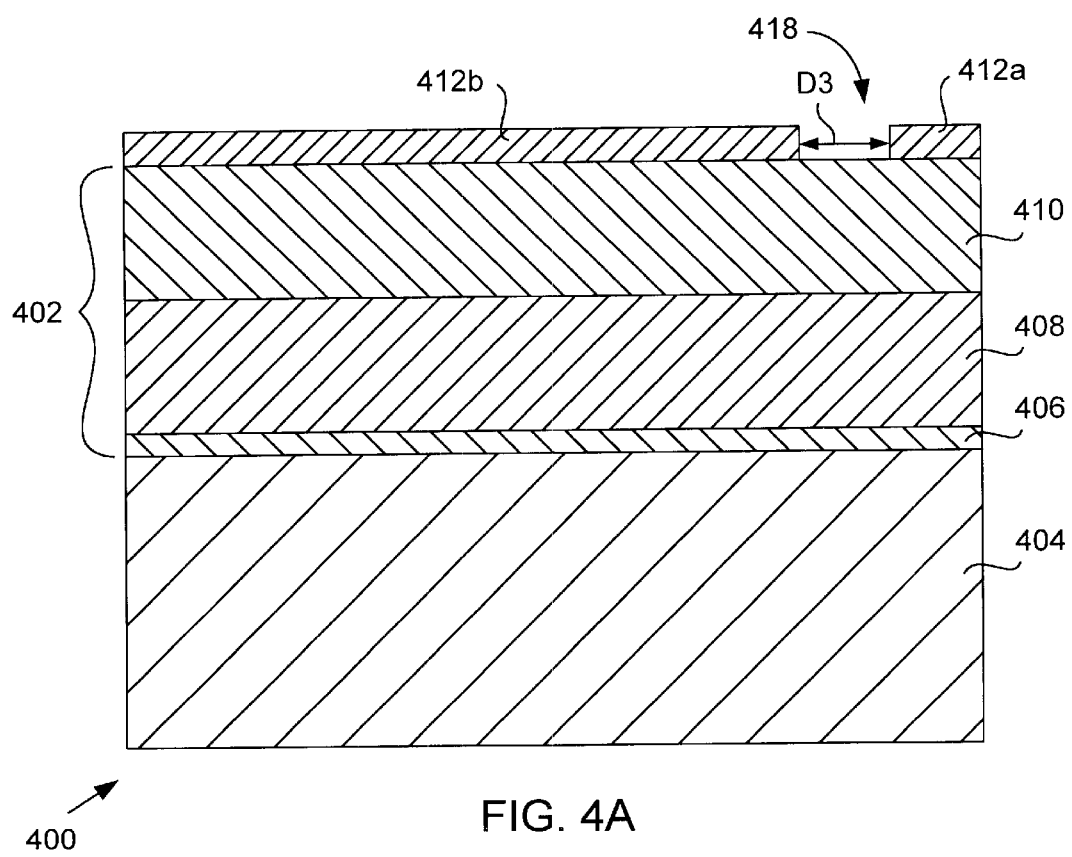
FIGS. 4a–4b illustrates an exemplary cross sectional view of a wafer that can be processed in the plasma processing chamber shown in FIG. 3 in accordance with an embodiment of the present invention.

To facilitate further discussion of the invention, FIG. 4A illustrates an exemplary cross sectional view of a wafer 400 that is suitable for processing in a plasma processing chamber, e.g., the plasma processing chamber 300 of FIG. 3. The wafer 400 is shown as having an exemplary layer stack 402 disposed above the surface of a substrate 404. By way of example, the layer stack 402 can include an oxide layer 406, a polysilicon layer 408, and a dielectric layer 410. The oxide layer 406, typically comprising $SiO_2$, can be disposed above the substrate 404. The polysilicon layer 408 is disposed above the oxide layer 406. Finally, a dielectric layer 410, e.g., BPSG, $SiO_2$, may be disposed above the polysilicon layer 408.

It should be noted that there may be present other additional layers above, below, or in between the layers shown in layer stack 402. Further, not all of the shown layers need necessarily be present and/or some or all of the layers may be substituted by other layers. The exemplary layers of the layer stack 402 are readily recognizable to those skilled in the art and may be formed using any of a number of suitable and known deposition processes, including chemical vapor deposition (CVD), plasma-enhanced chemical vapor deposition (PECVD), and a physical vapor deposition (PVD), such as sputtering.

To form the various features, e.g., interconnect lines, via connections, trenches, and other component regions that may be required in an integrated circuit, portions of certain layers of the layer stack 402 including, for example, the dielectric layer 410, may be etched using suitable etchant chemicals.

Prior to etching, the wafer 400 is typically prepared using a suitable photoresist technique. By way of example, one such photoresist technique may involve the patterning of the photoresist layer 412 by exposing the photoresist material in a contact or stepper lithography system, and the development of the photoresist material to form a mask to facilitate subsequent etching. FIG. 4A illustrates masked photoresist regions 412a and 412b, representing regions of photoresist layer 412 that have been left behind following the photoresist patterning step to protect the underlying regions. Area 418 represents an unetched feature through which portions of the underlying target layer(s), e.g., dielectric layer 410, are exposed for etching.

The area 418 has dimension D3 (between masked regions 412a and 412b) which represents the desired width dimension (or pre-etch width dimension) of a feature to be etched in the area 418 through the dielectric layer 410. By way of example, for relatively small features, dimension D3 can be about 0.25 μm.

Once properly masked for etching, the wafer 400 may then be etched using an appropriate etchant that is released into a plasma processing chamber such as the plasma processing chamber 300. During etching, the areas of the target layer(s) that are left exposed to the etchant, e.g., portions of layer 410 in area 418, may be etched away. The areas underlying the protective photoresist mask regions, e.g. 412a and 412b, are not etched. In this manner, features can be formed on the wafer 400.

Figure 4B:
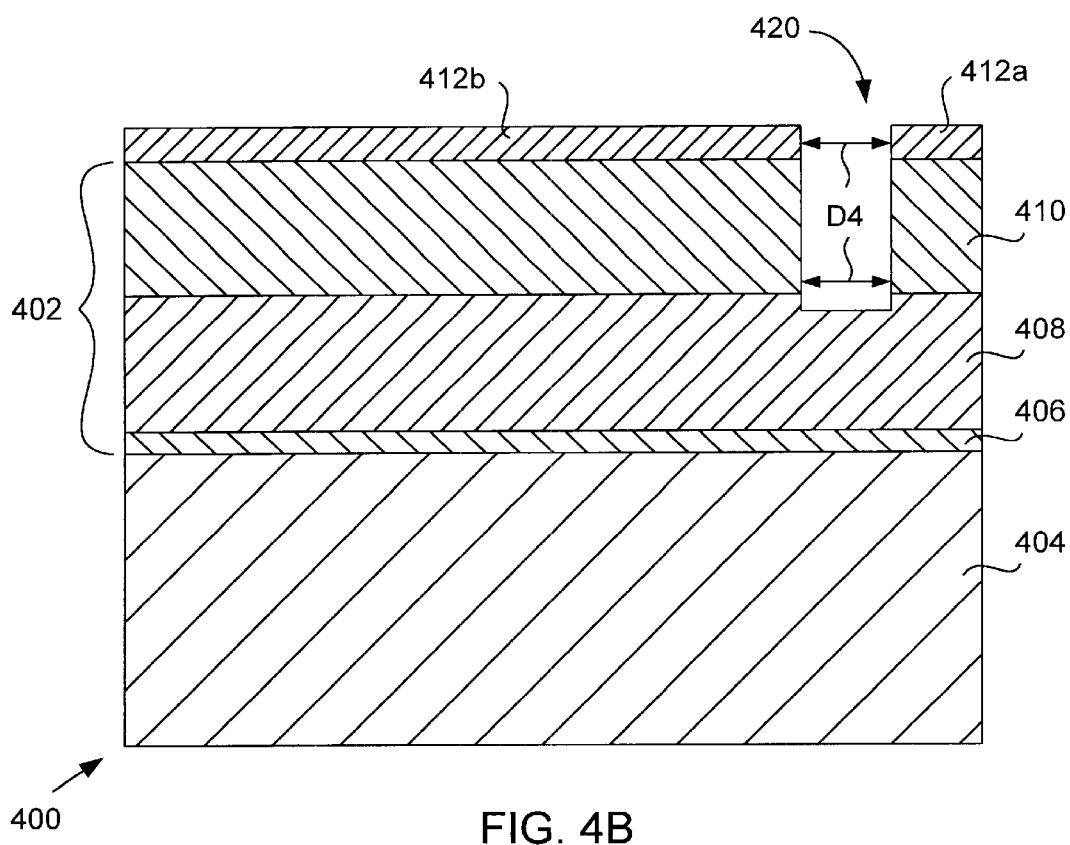

As illustrated in FIG. 4B, after the etching process is performed, in accordance with an embodiment of the preset invention, a region 420 is etched. The region 420 extends through the layer 410 and a portion of the layer 408. A dimension (gap) D4 represents the post-etch width dimension of the feature that has been etched in the region 420.

In comparison with conventional etching processes, the post-etch width dimension D4 (FIG. 4B) is significantly closer to the desired (or the pre-etch) width dimension D3 (FIG. 4A). By way of example, in the case when the pre-etch width dimension D3 is about 0.25 μm, post-etch width dimensions that are not larger than 0.28 μm can be achieved. This yields an upper limit of about 12% for the critical dimension bias. Thus, the present invention can be utilized to reduce the critical dimension bias to a range that is lower than 0.03 μm. In contrast, other chemistries including the combination of $C_4F$ and $N_2$, have been reported to yield a critical dimension bias on the order of 0.05 μm. As it will be appreciated by those skilled in the art, for some etching processes, using the improved techniques of the present invention can substantially eliminate the critical dimension bias even with fabrication of small features.

Figure 5:
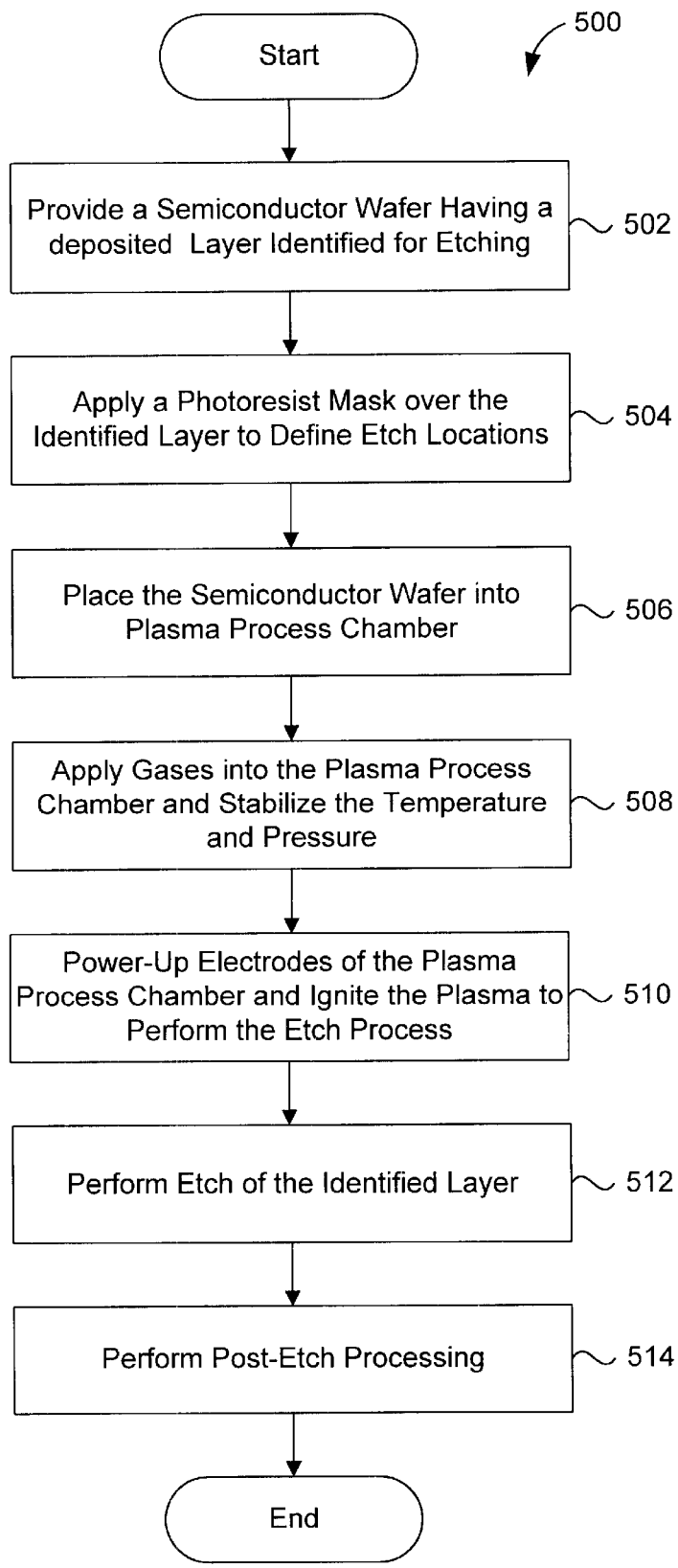
FIG. 5 is a flow chart illustrating a method for etching a deposited layer material in the plasma processing chamber shown in FIG. 3 in accordance with an embodiment of the present invention.

FIG. 5 is a flow chart illustrating a method 500 for etching a deposited layer material in a plasma processing chamber, in accordance with an embodiment of the present invention. By way of example, a medium density plasma reactor such as LAM 4520 XLE or LAM Exelan, can be utilized in conjunction with the method 500 to etch features that are about a quarter micron (0.25 μm) or smaller.

The method 500 begins at an operation 502 where a semiconductor wafer having a layer identified for etching is provided. Preferably, the layer identified for etching is a dielectric layer that is deposited to a suitable thickness ranging between about 5,000 angstroms to about 20,000 angstroms. By way of example, the layer can be a dielectric layer as illustrated by the layer 410 of FIG. 4A, e.g., BPSG, PSG, $SiO_2$, and TEOS.

Next, the method 500 proceeds to an operation 504 where a photoresist mask is applied over the identified layer to define etching locations (as shown in FIG. 4, this photoresist mask can be represented by the layer 412). By way of example, the photoresist mask can be patterned to define locations where features such as holes, contacts, self-aligned contact or trenches will be formed after the etching operation. Once the photoresist mask is applied, the method 500 proceeds to an operation 506 where the semiconductor wafer is placed into a plasma process chamber.

Once the wafer is placed inside the plasma processing chamber, in accordance with an embodiment of the present invention, inventive gas chemistries are applied inside the plasma processing chamber and allowed to stabilize to a suitable temperature and pressure. In accordance with this particular embodiment, the inventive gas chemistries consist primarily of a mixture of $C_3F_6$ and $O_2$ gases which is introduced to the plasma processing chamber.

The $C_3F_6$ gas can flow into the plasma processing chamber at a flow rate that is in a range between 5 to 20 standard cubic centimeters per minute (sscm). By way of example, the preferred flow rate for a 150 mm wafer in a medium density plasma processing chamber is at about 8 to 18 sscm. The $O_2$ gas can be flown into the plasma processing chamber at a flow rate that is in a range between 2 to 10 sscm. By way of example, the preferred flow rate for a 150 mm wafer in a medium density plasma processing chamber is at about 4 to 8 sscm.

As has become evident, fluorocarbons, e.g., $C_2F_6$ $C_3F_6$, and $C_4F_8$, can be utilized to counter some adverse side effects of the etching process, e.g., micro loading. In addition, the combination of $C_3F_6$ and $O_2$ can provide numerous other advantages. As is known in the art, $O_2$ can advantageously reduce passivation to enhance side wall control. Moreover, the combination of $C_3F_6$ and $O_2$ can effectively reduce the critical dimension bias of the etched features.

In addition to $C_3F_6$ and $O_2$, argon (Ar) may also be provided as a dilutant. Ar an also flow in the processing chamber at a flow rate that is between about 0 and 600 sscm. The Ar gas can flow into the plasma processing chamber at a flow rate that is in a preferred rage that is between 60 to 300 sscm. In accordance with one particular embodiment, for a 150 mm wafer, in a medium density plasma processing chamber, the Ar gas is initially flown at about 250 sscm. It should be noted that other gases besides Ar can be used as a dilutant, e.g. He, Ne, and Kr.

The pressure is stabilized when it is between about 15 mTorr and 100 mTorr. The temperature is maintained at about 10 to 50 degrees Celsius. In one particular embodiment used for a 150 mm wafer, in a medium density plasma processing chamber, the pressure is preferably established at about 30 mTorr. The temperature for the top electrode is preferably at about 30 degrees Celsius with the temperature for the lower electrode ranging in a preferred range that is between −2 to 10 degrees Celsius.

After the plasma process chamber has been stabilized (in accordance with operation 508), the method 500 will proceed to an operation 510 where the electrodes of the plasma process chamber are powered-up and the plasma is ignited to perform the etching process. The total power that is provided to the bottom and the top electrodes is generally between 1000 to 4000 Watts (W). In one particular embodiment used for a 150 mm wafer, in a medium density plasma processing chamber, the total power that is provided to the bottom and the top electrodes is in a preferred range that is between 1500 to 3600 Watts (W).

Next, the method 500 proceeds to an operation 512 where the etching process is performed through the identified layer in operation 502. The etching is performed using the inventive chemistries of the present invention. In accordance with an embodiment, the inventive gas chemistries consist primarily of a mixture of $C_3F_6$ and $O_2$ gases that are introduced to the plasma processing chamber. As mentioned above, a dilutant gas, e.g., Ar, can also flow in the chamber. Once etching is complete, the method 500 proceeds to an operation 514 where conventional post-etch processing is performed.

As is well known in the art the post etching operation 512 can include stripping the mask either externally or internally in the processing chamber. In addition, the wafer is released from the chuck and removed from the processing chamber. By way of example, the release of the wafer from the chuck can be accomplished by lowering the electrostatic charge to the chuck while increasing the flow of the dilutant gas, e.g., Ar, into the processing chamber.

The etching method 500 can be repeated until the desired features are etched on the substrate. In this manner, a variety of devices can be fabricated. By way of example, the finished wafer may be cut into dies, which may then be made into integrated circuit chips. The resulting chip may then be incorporated in an electronic device, e.g., any of the of well known commercial or consumer electronic devices, including digital computers.

This invention has numerous advantages. One advantage is that the critical dimension bias for etched features is significantly reduced. As noted above, the inventive gas chemistries of the present invention can be utilized to achieve a critical dimension bias that is no larger than 0.03 $\mu$m. In comparison, other chemistries, including those that have utilized $C_4F_8$ gases, have been reported to achieve a critical bias on the order of 0.05 $\mu$m. Thus, the inventive chemistries of the present invention can provide significant improvements for the etching process. These improvements are especially needed in situations where a low critical dimension bias is a requirement for the fabrication.

It is believed that the inventive combinations of the $C_3F_6$ and $O_2$ gases provide for a better control of the etching process by allowing a significantly higher flow rate ratio of the fluorocarbon gas, $C_3F_6$ to $O_2$. By way of example, in comparison to the $C_4F_8$ based chemistries, the inventive chemistries of the present invention can significantly increase the flow rate ratio of the fluorocarbon gas (e.g., $C_2F_6$, $C_3F_6$, and $C_4F_8$) to the $O_2$ gas.

As has become evident, higher flow rate ratios of the fluorocarbon gases to the $O_2$ can significantly decrease adverse side effects such as the critical dimension bias. Unfortunately, with other chemistries, including $C_4F_8$, it is not possible to increase the flow rate ratio of the fluorocarbon gas to a point where the critical dimension bias is effectively reduced below 0.05 $\mu$m. That is, increasing the flow rate ratio of the $C_4F_8$ gas to the $O_2$ gas, results in adverse effects to the etching process before the critical dimension bias can be reduced to an acceptable value (i.e., lower than 0.05 $\mu$m). One such adverse side effect is known as "etch stop." By way of example, etch stop is encountered when the flow rate ratio of $C_4F_8$, to $O_2$ is increased beyond a 1.83:1 ratio. With $C_3F_6$, however, it is possible to achieve flow rate ratios that are about 2.83:1 before etch stop is encountered.

Thus, other fluorocarbons, including $C_4F_8$ provide a relatively small window where the flow rate of the fluorocarbon, e.g., $C_4F_8$, gas to $O_2$ gas can be increased before etch stop and/or other adverse effects are encountered. To illustrate, for a 150 mm wafer with about 16 sccm of $O_2$ gas, the typical range for the flow of the $C_4F_8$ gas is about 6 to 10 sccm. In contrast, for the same 150 mm wafer with the same rate of the $O_2$ gas flow (6 sccm) in the chamber, about 12 to 16 sccm of the $C_3F_6$ gas can flow in the plasma processing chamber.

Higher flow rate ratios for $C_3F_6$ to $O_2$, significantly enhance the control of the etching process. As a result, the critical dimension bias can be reduced. Contrarily to traditional teachings in the art, it is believed that in comparison to the gas $C_4F_8$, the $C_3F_6$ gas is less polymerized. Thus, in a non-obvious manner, $C_3F_6$ may actually provide a larger ratio of the free Fluorine (F) to the free carbon (C) than $C_4F_8$, can normally provide. Free carbon is believed to block the etching process, causing etch stop to be encountered at significantly lower flow rate ratios of the $C_4F_8$ gas.

FIG. 6 illustrates in a table 600, some exemplary flow rate ratios of the fluorocarbon gases $C_4F_8$ and $C_3F_6$ to the $O_2$ gas. The flow rate ratios shown for the $C_4F_8$ gas can be achieved, in accordance to several embodiments of the present invention. As it will be understood by those skilled in the art, the parameters shown in table 600 correspond to 18 mT of chamber pressure, 700 W and 100 W for the top and the bottom electrode power, respectively, with 120 sccm of Ar flowing, a temperature of 300° C. for the upper electrode, and in a medium density plasma processing system.

By way of example, row 602 indicates some of the parameters for an etching process that utilizes the $C_4F_8$ gas. As indicated in row 602, 9.5 sccm of the $C_4F_8$ gas is flown to 6 sccm of oxygen, with the lower electrode temperature at 10 Centigrade and the etching process being performed for 180 seconds. For the $C_4F_8$ and $O_2$ process, a flow rate ratio of 1.58($C_4F_8$): 1($O_2$) is achieved.

In comparison, significantly higher flow rate ratios can be achieved when the $C_3F_6$ gas is used in the etching process. By way of example, as indicated by row 604, for the same parameters as the $C_4F_8$ process of row 602 (i.e., the same rate of flow of the $O_2$ gas, same lower electrode temperature and the same etch processing time), 14 sccm of $C_3F_6$ can be flown in the processing chamber (in comparison to 9.5 sccm). As a result, a flow rate ratio of 2.33 ($C_3F_6$): 1($O_2$) can be achieved.

As illustrated in table 600, it is possible to achieve even higher flow rate ratios than 2.33 ($C_3F_6$): 1 ($O_2$). By way of example, rows 606–610 indicate respectively, flow rate ratios of 2.50, 2.67, and 2.83. As demonstrated by the processes of rows 606–610, the temperature for the lower electrode can be reduced to achieve even higher flow rates. The temperature for the lower electrode for the processes of rows 606–610 is about –10° C. However, it is anticipated that the temperature for the lower electrode can be further reduced to achieve even higher flow rate. Therefore, the inventive gas chemistries allow higher flow rates which yield substantial improvements in critical dimension bias.

Another advantage of the invention is that other undesired effects associated with the etching process, e.g., "bowing", can be reduced effectively. Bowing is well known in the art and, as used herein, refers generally to the problem of having features, e.g., trenches that are not etched straight down (i.e., there is a bowing effect on one or both of the side walls of the etched feature.) Bowing can seriously hinder the operability of a desired etched feature or render a device defective. As discussed earlier, the integrated circuits have become increasingly small and there is less and less tolerance for error. Thus, problems such as critical dimension bias and bowing have gained increasingly more prominence. It is believed that by increasing the flow rate of the fluorocarbon gas ($C_3F_6$) and/or reducing the temperature of the lower electrode, undesired effects such as bowing can be reduced.

Yet another advantage of the present invention is that by reducing the critical dimension bias, higher aspect ratios for the etched features can be achieved. Aspect ratio can be defined as the ratio of the depth of a feature to its width. By way of example, for a feature that is about 1.8 $\mu$m deep and about 0.24 $\mu$m wide, the aspect ratio is about 7.5. Generally, the larger the aspect ratio, the more difficult it would be to etch the feature according to the desired specification. By way of example, with conventional methods for an aspect ratio of 7.5, a critical dimension bias of 0.05 $\mu$m or higher can be expected. In accordance to a particular embodiment of the present invention, it is possible to achieve a critical dimension bias of 0.03 $\mu$m or lower for an etched feature with the aspect ratios of 7.5.

As it will be appreciated by those skilled in the art, the present invention can be utilized to form a variety of etched features such as contacts, via interconnection, veers, and etc. Further, As it will be understood by those skilled in the art, the present invention can also be used in conjunction with a variety of other techniques such as dual damascene techniques.

Although only a few embodiments of the present invention have been described in detail, it should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. In a plasma processing chamber for processing a wafer, a method of etching a dielectric layer of material that is deposited on the wafer, the method comprising:

flowing an etchant source gas into the plasma processing chamber, the etchant source gas consisting essentially of $C_3F_6$ gas and $O_2$ gas;

striking a plasma that is formed from the etchant source gas;

performing an etch process by etching a portion of the dielectric layer of material using the plasma; and wherein the etch process etches a feature on the dielectric layer, the feature having a difference between pre-etch and post-etch dimensions that is lower than about 0.05 $\mu$m.

2. A method as recited in claim 1, wherein the dielectric layer is a layer of oxide film.

3. A method as recited in claim 2, wherein the layer of oxide film is selected from the group consisting of borophosphosilicate glass (BPSG), phosphosilicate glass (PSG), silicon oxide ($SiO_2$), and TEOS.

4. A method as recited in claim 2, wherein the flow rate for the $C_3F_6$ gas is within a range that is between 5 to 30 standard cubic centimeters per minute (sccm).

5. A method as recited in claim 2, wherein the flow rate for the O2 gas is within a range that is between 2 to 10 standard cubic centimeters per minute (sccm).

6. A method as recited in claim 2, wherein the plasma processing chamber includes a lower electrode and the temperature for the lower electrode is in a range that is between –10 to 15 degrees centigrade.

7. A method as recited in claim 2, wherein the flow rate for the $C_3F_6$ gas is within a range that is between 8 to 18 standard cubic centimeters per minute (sccm).

8. A method as recited in claim 2, wherein the flow rate for the $O_2$ gas is within a range that is between 4 to 8 standard cubic centimeters per minute (sccm).

9. A method as recited in claim 2, wherein the plasma processing chamber includes a lower electrode and the temperature for the lower electrode is within a range that is between −2 to 10 degrees centigrade.

10. A method as recited in claim 2, wherein the flow rate for the $C_3F_6$ gas is at about 15 to 16 standard cubic centimeters per minute (sccm).

11. A method as recited in claim 2, wherein the flow rate for the $O_2$ gas is at about 6 standard cubic centimeters per minute (sccm).

12. A method as recited in claim 2, wherein the plasma processing chamber includes a lower electrode and the temperature for the lower electrode is at about −2 degrees centigrade.

13. A method as recited in claim 2, wherein the plasma processing chamber includes a lower electrode, the $C_3F_6$ gas flows at a flow rate that is between 15 to 16 standard cubic centimeters per minute (sccm), the $O_2$ gas flows at a flow rate is at about 6 centimeters per minute (sccm), and the temperature for the low electrode is at about −2 degrees centigrade.

14. A method as recited in claim 13, wherein the processing time for the etching the oxide layer is about 180 seconds.

15. A method as recited in claim 13, wherein total power provided to the processing chamber is about 1700 Watts (W).

16. A method as recited in claim 13, wherein the method further comprises flowing Argon gas into the processing chamber as a dilutant gas and the Argon flows in the processing chamber at a flow rate within a range that is between 60 to 300 centimeters per minute (sccm).

17. A method as recited in claim 2, wherein total power provided to the processing chamber is within a range that is between 1200 to 3600 Watts (W).

18. A method as recited in claim 2, wherein processing time for the etching the oxide layer is between 100 to 300 seconds.

19. A method as recited in claim 2, wherein processing time for the etching the oxide layer depends on thickness of the oxide layer.

20. A method as recited as in claim 1, wherein the method further comprises flowing Argon gas as a dilutant gas into the processing chamber.

21. A method as recited in claim 1, wherein the etching is done to form contacts.

22. A method as recited in claim 1, wherein the etching is done to form vias.

23. A method as recited in claim 1, wherein the etching is done in a dual damascene process.

24. A method as recited in claim 2, wherein the etch process etches a feature on the dielectric layer that is in order of about 0.2 to 0.3 $\mu$m, the feature having a difference between pre-etch and post-etch dimensions that is lower than about 0.03 $\mu$m.

25. A method a recited in claim 23, wherein the critical dimension bias is obtained for etching that has a width of about 0.25 $\mu$m.

26. A method as recited in claim 2, wherein the ratio of flow of $C_3F_6$ gas to the $O_2$ gas is in a range that is between 2 to 3.

27. A method as recited in claim 2, wherein for a feature with 7.5 aspect ratio, a critical dimension bias that is not larger than 0.03 $\mu$m is achieved.

28. A method as recited in claim 2, wherein the etch process etches a feature on the dielectric with a width of about 0.25 $\mu$m or smaller.

29. In a plasma processing chamber for processing a wafer, a method of etching a dielectric layer of material that is deposited on the wafer, the method comprising:

flowing an etchant source gas into the plasma processing chamber, the etchant source gas consisting essentially of $C_3F_6$ gas and $O_2$ gas;

flowing a dilutant gas into the plasma processing chamber;

striking a plasma that is formed from the etchant source gas;

performing an etch process by etching a portion of the dielectric layer of material using the plasma; and wherein the etch process etches a feature on the dielectric layer, the feature having a difference between pre-etch and post-etch dimensions that is lower than about 0.05 $\mu$m.

30. A method as recited in claim 28, wherein the dilutant gas is selected from the group of gases consisting of Ar, He, Ne, and Kr.

31. A method as recited in claim 28, wherein the dielectric layer is a layer of oxide film.

32. In a plasma processing chamber for processing a wafer, a method of etching a dielectric layer of material that is deposited on the wafer, the method comprising:

flowing an etchant source gas into the plasma processing chamber, the etchant source gas consisting of $C_3F_6$ gas and $O_2$ gas;

striking a plasma that is formed from the etchant source gas;

performing an etch process by etching a portion of the dielectric layer of material using the plasma, and herein the etch process etches a feature on the dielectric layer, the feature having a difference between pre-etch and post-etch dimensions that is lower than about 0.05 $\mu$m.

* * * * *